United States Patent [19]

Maeda et al.

[11] Patent Number: 5,110,766
[45] Date of Patent: May 5, 1992

[54] METHOD OF MANUFACTURING A SEMICONDUCTOR DEVICE INCLUDING FORMING A FLATTENING LAYER OVER HOLLOWS IN A CONTACT HOLE

[75] Inventors: Satoshi Maeda; Shizuo Sawada; Satoshi Shinozaki, all of Yokohama, Japan

[73] Assignee: Kabushiki Kaisha Toshiba, Kangawa, Japan

[21] Appl. No.: 549,632

[22] Filed: Jul. 6, 1990

Related U.S. Application Data

[63] Continuation of Ser. No. 225,494, Jul. 28, 1988, abandoned.

[30] Foreign Application Priority Data

Jul. 28, 1987 [JP] Japan .................. 62-188241
Feb. 19, 1988 [JP] Japan .................. 63-36767

[51] Int. Cl.$^5$ .......................... H01L 21/465
[52] U.S. Cl. ...................... 437/228; 437/231; 437/193; 437/194; 437/195
[58] Field of Search ............... 437/193, 194, 195, 231, 437/228; 148/DIG. 109

[56] References Cited

U.S. PATENT DOCUMENTS

| | | | |
|---|---|---|---|
| 4,404,733 | 9/1983 | Sasaki | 437/41 |
| 4,453,306 | 6/1984 | Lynch et al. | 437/964 |
| 4,874,493 | 10/1989 | Pan | 437/228 |
| 4,894,351 | 1/1990 | Batty | 437/231 |

FOREIGN PATENT DOCUMENTS 0190928 8/1986 European Pat. Off. .

OTHER PUBLICATIONS

J. E. J. Schmitz et al, "A New Approach to Contact Fill", Materials Research Society 1989 pp. 129–132.
Ghandhi, VLSI *Fabrication Principles*, John Wiley and Sons New York (1983) pp. 432–433.

Primary Examiner—Brian E. Hearn
Assistant Examiner—Laura M. Holtzman
Attorney, Agent, or Firm—Finnegan, Henderson, Farabow, Garrett and Dunner

[57] ABSTRACT

A method of manufacturing a semiconductor device, in particular a contact portion of the wiring of the device. An insulating layer is formed on a semiconductor substrate, a contact hole is formed on the insulating layer by etching, and a first conductive layer having hollows is formed on the insulating layer and in the contact hole. Next, a flattening layer is formed to flatten the surface of device structure, and a part of the first conductive layer is exposed by etching the flattening layer to permit a part of the flattening layer to remain in hollows of device structure. Next, a second conductive layer is formed on the remaining flattening layer and the exposed part of the first conductive layer, and is connected to the semiconductor substrate.

1 Claim, 6 Drawing Sheets

METHOD OF MANUFACTURING A SEMICONDUCTOR DEVICE INCLUDING FORMING A FLATTENING LAYER OVER HOLLOWS IN A CONTACT HOLE

This application is a continuation of application Ser. No. 07/225,494 filed Jul. 28, 1988 now abandoned.

BACKGROUND OF THE INVENTION

The present invention relates to a method of manufacturing semiconductor device and, more particularly, to a method of manufacturing a reliable and highly integrated wiring.

FIG. 1 is a sectional view of two memory cells of a Dynamic Random Access Memory (DRAM). N-type diffusion regions 12 and 13 of storage capacitors and n-type diffusion region 14 of a selection transistor are formed on p-type semiconductor substrate 11. Capacitor electrodes 16 and 17 made of polysilicon are formed on insulating layers 15 overlying n-type diffusion regions 12 and 13. Word lines 19A and 19B made of polysilicon are formed on a part of semiconductor substrate 11 which is located between n-type diffusion region 12 and n-type diffusion region 14, and between n-type diffusion region 13 and n-type diffusion region 14, respectively. Word lines 19C and 19D of other memory cells are formed on capacitor electrodes 16 and 17, respectively, and insulating interlayer 23 is formed to cover the semiconductor structure. A contact hole 24 to the surface of n-type diffusion region 14 is formed in insulating interlayer 23, and bit line 25 is formed to connect with n-type diffusion region 14 through contact hole 24.

FIG. 2 shows an equivalent circuit of memory cells having the structure shown in FIG. 1. Each memory cell consists of a capacitor C and a selection transistor Q, each diffusion region of selection transistor Q is connected in common with a bit line BL, and a gate electrode of selection transistor Q is connected to respective word lines WL.

In the manufacturing method, since contact hole 24 is formed through insulating interlayer 23, it is necessary to allow a dimension margin L between word lines 19A and 19B to prevent any short circuit between each of word lines 19A and 19B and bit line 25. For example the dimension margin L needs must be about 1.0 μm for a 1.0 μm design rule device; therefore, according to conventional manufacturing methods, it is difficult to improve the microminiaturization of the structure.

To solve this problem, in another conventional method, the microminiaturization of the memory cell is realized by the method as shown in FIGS. 3(a)-3(c). In this method, after n-type diffusion regions 32 and 33 are formed on a p-type semiconductor substrate 31, insulation layer 34 and capacitor electrodes 35 and 36 are formed. A silicon dioxide layer, a polysilicon layer and a CVD silicon dioxide layer are formed on the semiconductor structure, successively, and are respectively formed into gate oxide layer 37; word lines 38A, 38B, 38C and 38D; and CVD silicon dioxide layers 39A, 39B, 39C and 39D by anisotropic etching (for example RIE (Reactive Ion Etching)). N-type diffusion region 40 of the selection transistor is formed by ion-implantation using word lines 38A, 38B, 38C and 38D as masks, at the same time all of n-type diffusion regions 32 and 33 are formed (FIG. 3(a)).

A CVD silicon dioxide layer is then formed on the whole surface, and antisotropicly etched to form CVD silicon dioxide and antisotropicly etched to form CVD silicon dioxide side walls of word lines 38A, 38B, 38C and 38D (FIG. 3(b)).

A CVD silicon dioxide layer is formed on the whole surface, and the portion of the just-formed CVD silicon dioxide layer which is located between word lines 38A and 38B is etched to form CVD silicon dioxide layer 43 having contact hole 42 to n-type diffusion region 40. Bit line 44 made of a polycide layer is then formed (FIG. 3(c)).

According to the method as described above, even if contact hole 42 is wide, word lines 38A, 38B, 38C and 38D covered with CVD silicon dioxide layer 43 cannot be etched. Thus, it is unnecessary to consider the superfluous dimension margin L and it is possible to improve the microminiaturization of the elements However, the memory cell formed by the method as described above exhibits a large difference in level across the surface thereof Breakage of bit line 44 on the corner of structure is thus apt to occur often.

To solve the problem described above, a method as shown in FIG. 4 is considered. In this method, before bit line 44 is formed, a silicate glass layer having a low melting point, for example BPSG (Boron Phosphorus Silicate Glass) layer 45, is formed on the whole surface and is flattened by thermal annealing. A contact hole is then formed through this layer. In this structure, thickness T1 of BPSG layer 45 above word lines 38A and 38B differs from that of thickness T2 of PBSG layer 45 above n-type diffusion region 40. Thus, when BPSG layer 45 is etched to form a contact hole for a bit line, there is the possibility that word lines 38A and 38B will be exposed, and a connection between one of the word lines and the bit line may be formed.

In the method as described above, it is possible to improve the microminiaturization of the elements, but opening of upper wiring is apt to occur often.

SUMMARY OF THE INVENTION

An object of the present invention is to provide a method of manufacturing a semiconductor device suitable for micro-miniaturizing a contact portion of device elements, the method providing a reliable wiring layer on the corner of the structure having different surface levels in which the wiring layer is less susceptible to opening.

According to the present invention, when forming a contact hole between a semiconductor substrate and a conductive layer, the contact hole is formed by etching a part of an insulation layer on the semiconductor substrate. A first conductive layer is formed to cover this contact hole. Then, a flattening layer is formed and flattened on the semiconductor substrate. A part of the first conductive layer is exposed by etching the flattening layer. Then, a second conductive layer is formed on a surface of the flattening layer, with a part of the first conductive layer being exposed.

DETAILED DESCRIPTION

Figure 1:
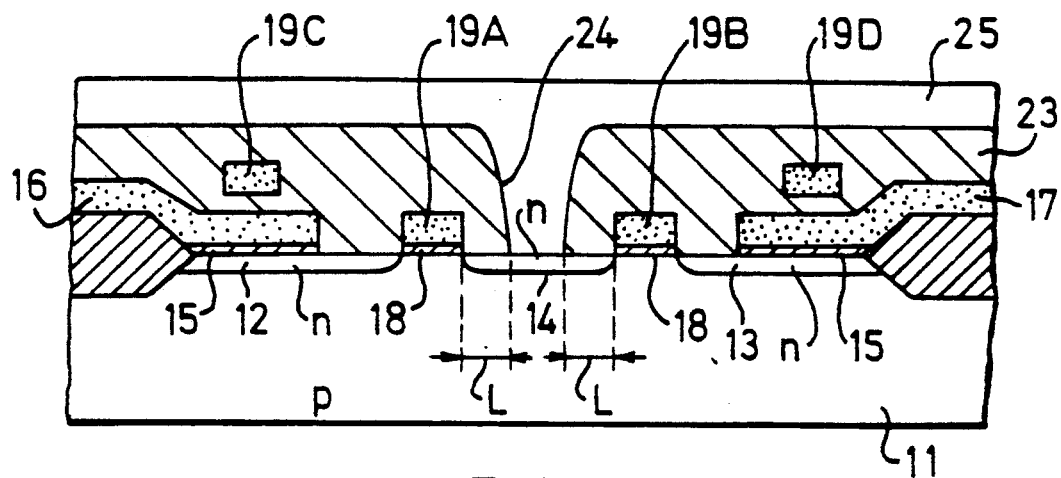
FIG. 1 is a sectional view showing a conventional semiconductor device for explanation of a method of manufacturing.
Figure 2:
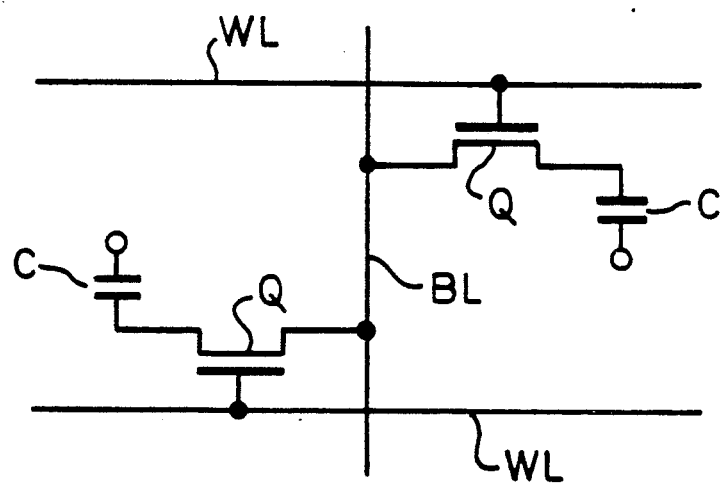
FIG. 2 is an equivalent circuit of the semiconductor device shown in FIG. 1.
Figure 3A:
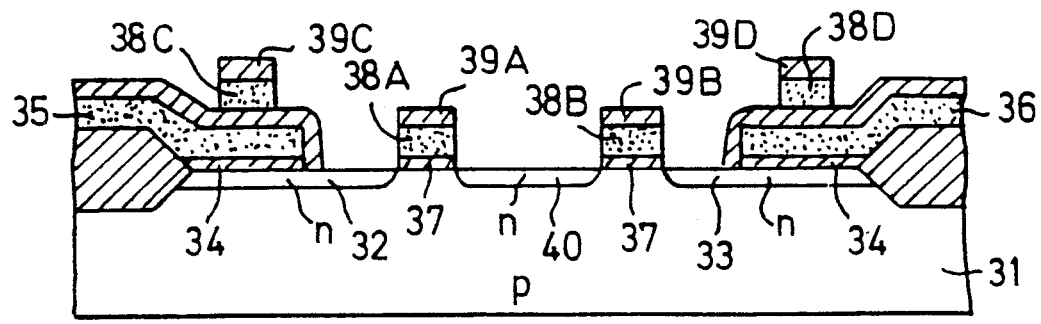
FIG. 3(a), 3(b), and 3(c) are sectional views showing steps of a conventional method of manufacturing a semiconductor device.
Figure 3B:
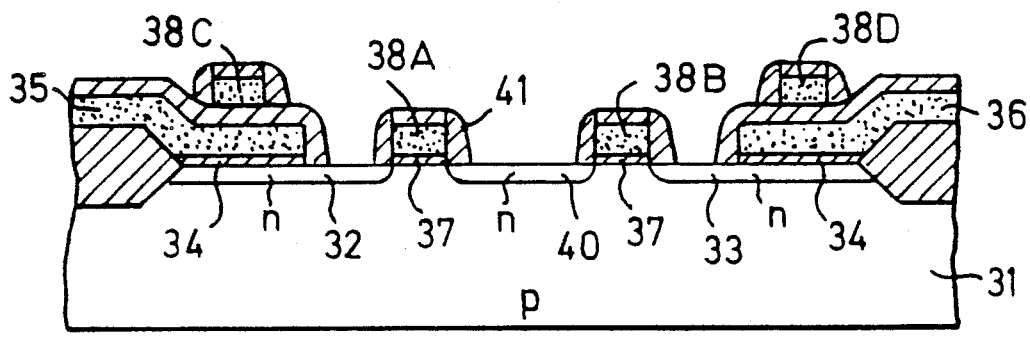
Figure 3C:
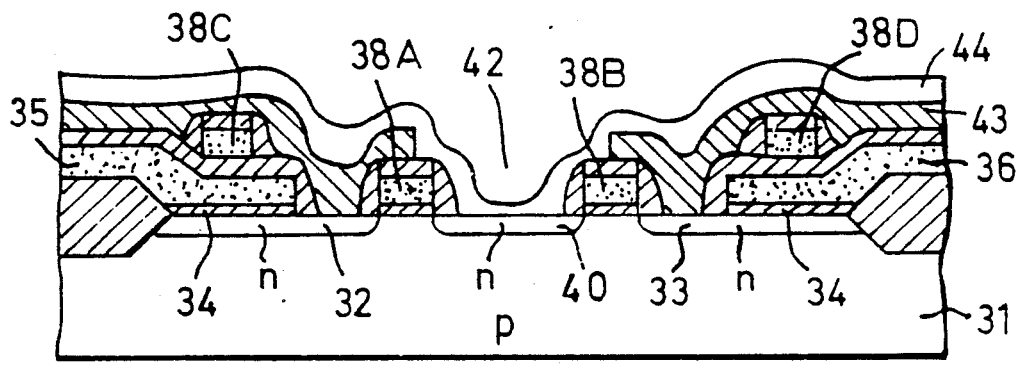
Figure 4:
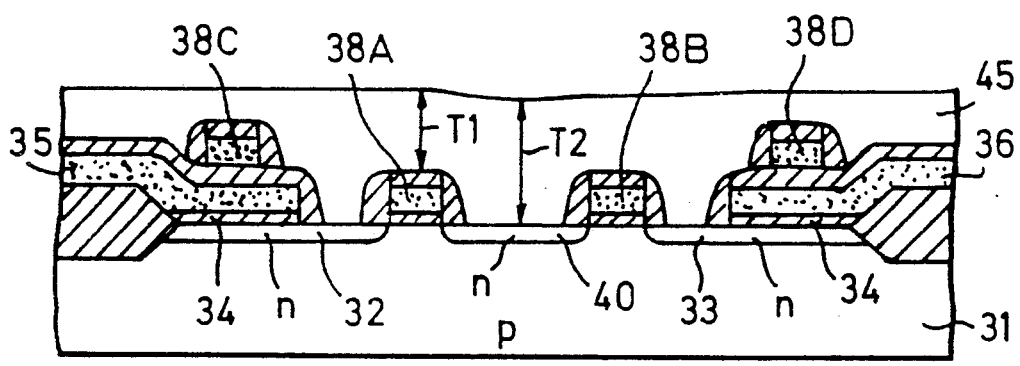
FIG. 4 is a sectional view showing a conventional semiconductor device for explanation of method of manufacturing.

Referring now to the drawings, a production DRAM (Dynamic Random Access Memory), which constitutes a preferred embodiment of the invention, will be described in detail.

Figure 5A:
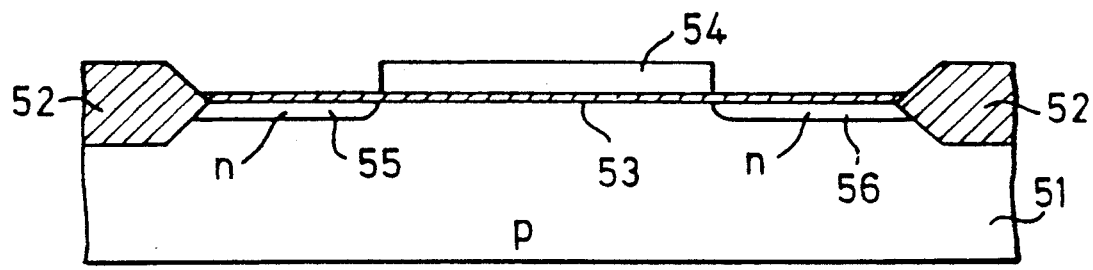
FIGS. 5(a) to (h) are sectional views showing steps of a method of manufacturing a semiconductor device according to a first embodiment of the present invention.

A first embodiment of the present invention will be described with reference to FIGS. 5a) to (h), which show the steps of manufacturing a DRAM according to the present invention.

Field oxide layer 52 for isolation of elements is formed on the surface of p-type silicon semiconductor substrate 51. Silicon dioxide layer 53 is formed on the surface of semiconductor substrate 51 by thermal oxidation, and photo resist 54 for use as a mask for ion implementation is formed on silicon dioxide layer 53. N-type impurity regions 55 and 56 are formed by implanting n-type ions, for example As (arsenic), into semiconductor substrate 51 using photo resist 54 (FIG. 5(a)).

Figure 5B:
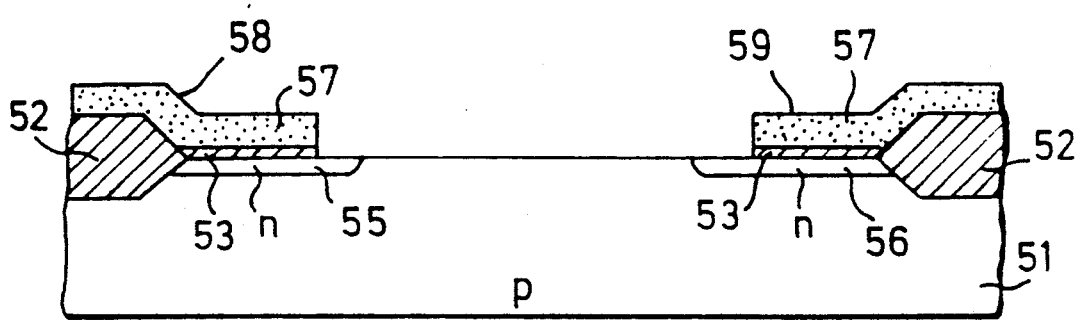

Next, photo resist 54 is removed, polysilicon layer 57 is formed on semiconductor substrate 51 by a CVD (Chemical Vapor Deposition) method, and capacitor electrodes 58 and 59 are formed by patterning polysilicon layer 57 and silicon dioxide layer 53 (FIG. 5(b)).

Figure 5C:
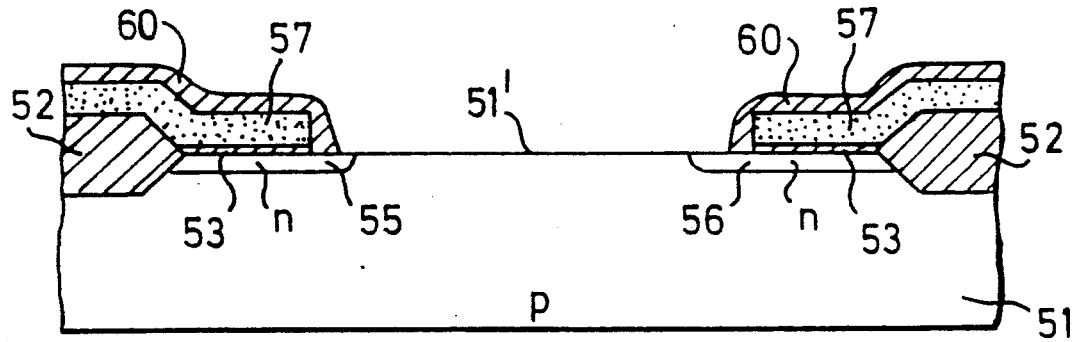

Next, silicon dioxide layer 60 is formed by oxidizing the surface of capacitor electrodes 58 and 59 and each polysilicon layer 57 by thermal oxidation. A portion of the silicon dioxide layer (not shown) formed on the surface of semiconductor substrate is then removed, so that a corresponding portion 51' of the surface of semiconductor substrate 51 is exposed (FIG. 5(c)).

Figure 5D:
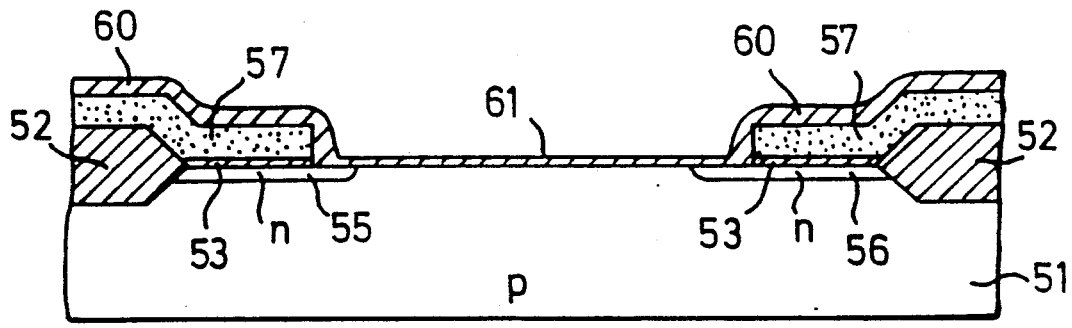
Figure 5E:
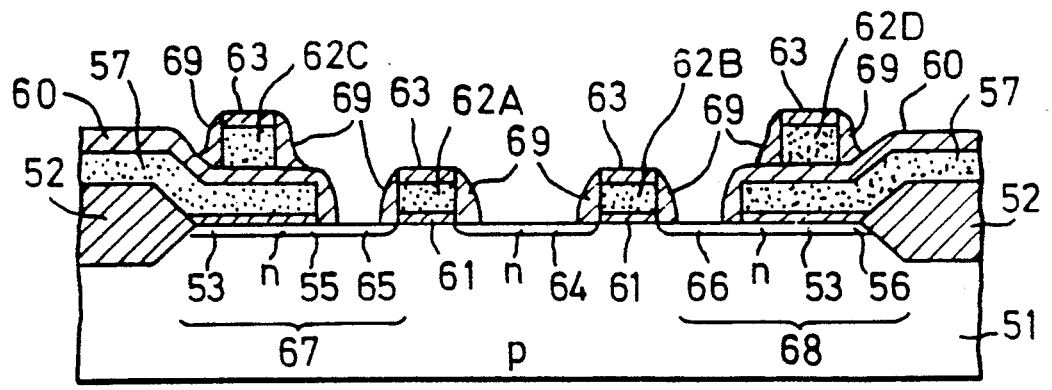
Figure 5F:
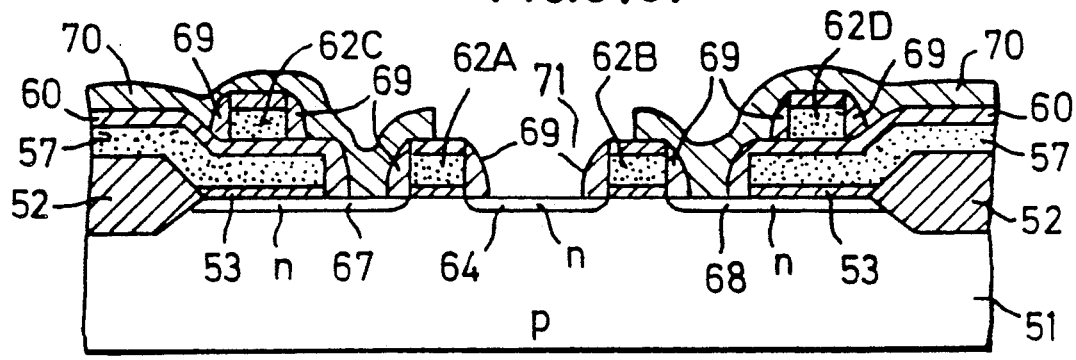
Figure 5G:
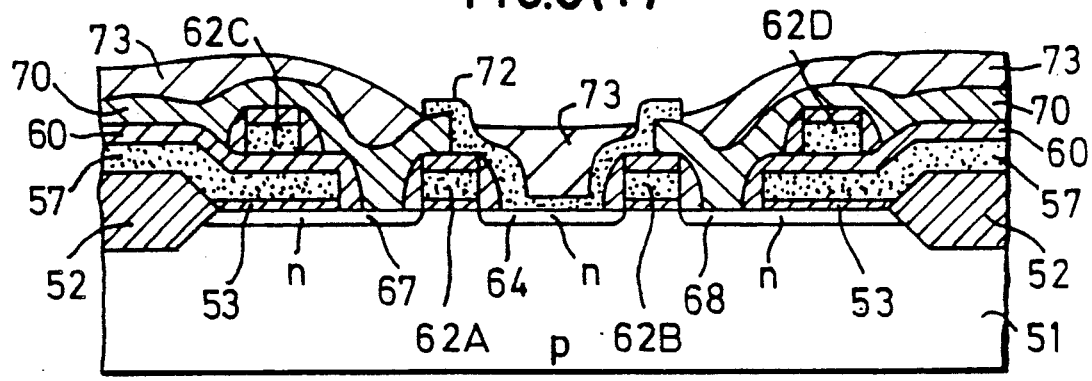

Next, silicon dioxide layer 61 is formed on the exposed surface 51' of semiconductor substrate 51 by thermal oxidation. This silicon oxide layer 61 will serve as a gate oxide layer of a MOS transistor which shall be formed later and has a thickness of a few hundred Å (FIG. 5(d)).

Next, polysilicon and silicon dioxide layers are formed on the whole surface by the CVD method and photoetched to form polysilicon word lines 62A, 62B, 62C and 62D and silicon dioxide layer 63. N-type diffusion region 64 of a selection transistor is then formed by implanting n-type ions, for example As, using word lines 62A, 62B, 62C and 62D and polysilicon layer 57 as masks. N-type impurity regions 65 and 66, which unite with n-type impurity regions 55 and 56 respectively, are thus formed. As a result, n-type impurity regions 55 and 65 and n-type impurity regions 56 and 66 together comprise n-type diffusion regions 67 and 68, so as to form two capacitors. A silicon dioxide layer is formed on the whole surface by the CVD method, and is removed by anisotropic etching (for example, Reactive Ion Etching) to form silicon dioxide layer 69 remaining on each side wall of each line 62A, 62B, 62C and 62D (FIG. 5 (e)).

Next, a silicon dioxide layer is formed on the whole surface by the CVD method, and silicon dioxide layer 70 is formed by anisotropic etching using a mask. In this case, it is preferable that the thickness of silicon dioxide layer 70 on silicon dioxide layer 63 is equal to the thickness of the silicon dioxide layer on n-type diffusion region 64 etched by the RIE method. As a result, contact hole 71 is formed between word lines 62A and 62B (FIG. 5(f)).

Next, a polysilicon layer having a thickness of about 1000 Å is formed on the whole surface by the CVD method, and removed selectively such that polysilicon layer 72 remains so as to cover contact hole 71. Flattening layer 73 having thickness of 7000 Å is then formed of a glass having a low melting point, for example, BPSG. BPSG layer 73 is flattened by thermal annealing to reduce surface level variations of layer 73. A part of polysilicon layer 72 is exposed by etching (for example, wet etching or RIE) BPSG layer 73. As a result, BPSG layer 73 remains in polysilicon layer 72 (FIG. 5(g)).

Figure 5H:
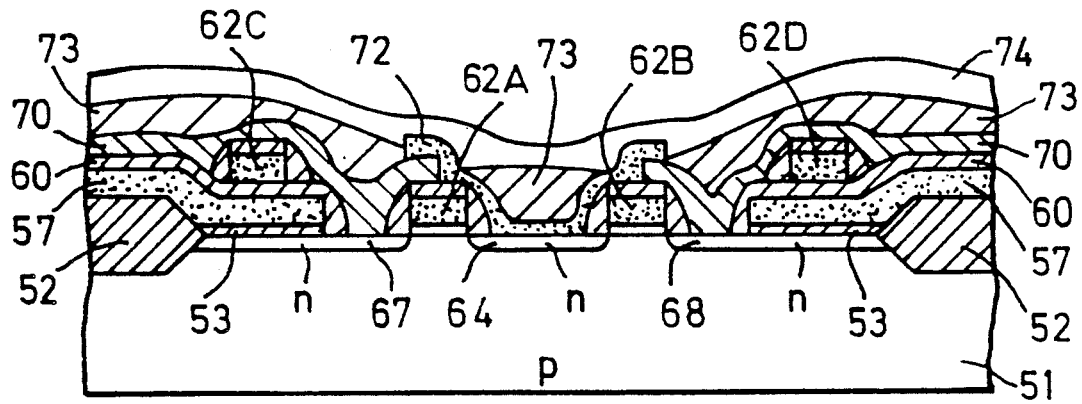

A polysilicon layer and a refractory metal layer (for example, molybdenum, tungsten, titanium) are formed in order, and etched by RIE to form bit line 74 made of silicide and polysilicon connected with polysilicon layer 72 (FIG. 5(h)).

According to the method of manufacturing a semiconductor device as described above, silicon dioxide layer 70 and BPSG layer 73 are formed on capacitor electrodes 58 and 59. Since the surface of BPSG layer 73 is substantially flattened, bit line 74 formed on BPSG layer 73 also becomes flat and thus exhibits a small variation in surface level. Therefore, it is possible to prevent bit line 74 from breaking or opening on the corner of the device.

Since polysilicon layer 72, which is formed to cover contact hole 71 and to contact bit line 74, is a self-aligned contact structure, it is possible to improve the microminiaturization of the elements.

Moreover, it is possible to establish positive contact between semiconductor substrate 51 and second conductive layer 74 using polysilicon as the material of first conductive layer 72. Polysilicon has good step coverage, that is, it flows easily and maintains continuity over step structures such as from layers 70 to 63 to 64, without cleaving and forming discontinuities.

It is also possible to lower the resistance value of the wiring by using aluminum as the material of second conductive layer 74.

Figure 6:
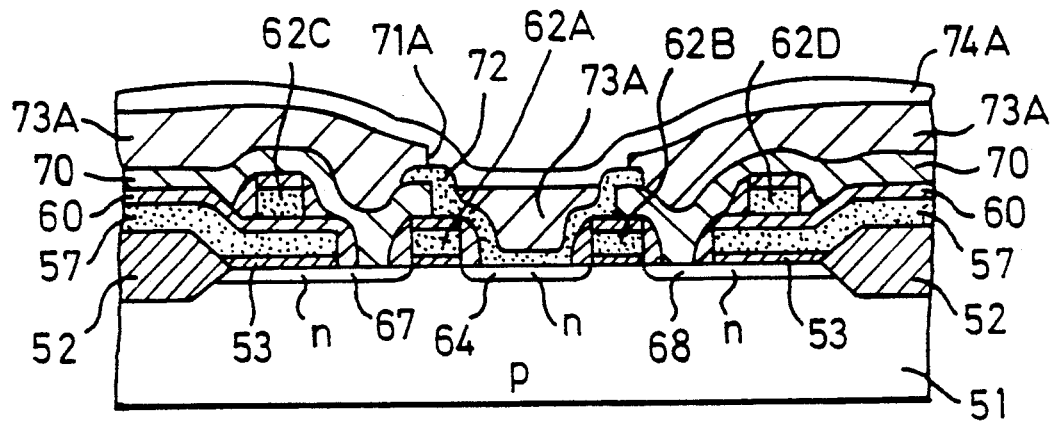
FIG. 6 is a sectional view showing a semiconductor device for explanation of a method of manufacturing according to a second embodiment of the present invention.

A second embodiment of the present invention will be described with reference to FIG. 6, which shows a sectional view of a DRAM for explaining a method of manufacturing.

In the first embodiment of the present invention, after polysilicon layer 72 is formed, BPSG layer 73 is formed and is flattened by thermal annealing, and a part of polysilicon layer 72 is exposed by etching of the surface of the BPSG layer. As compared with the first embodiment of the present invention, in the second embodiment of the present invention, after BPSG layer 73A is formed and is flattened, contact hole 71A is formed in BPSG layer 73A by using masks, and bit line 74 is formed on the surface of the structure.

Figure 7:
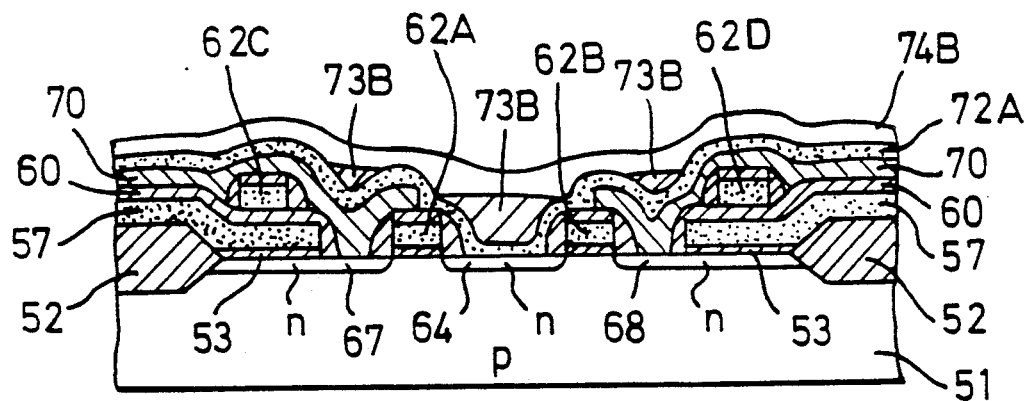
FIG. 7 is a sectional view showing a semiconductor device for explanation of a method of manufacturing according to a third embodiment of the present invention.

A third embodiment of the present invention will now be described with reference to FIG. 7, which shows a sectional view of a DRAM for explaining the method of manufacturing.

The steps of the method of this embodiment are the same as shown in FIGS. 5(a) to (f). Polysilicon layer 72A is formed on the whole surface. After layer 73B of silicate glass having a low melting point (for example, BPSG) and having a thickness of 7000 Å is formed on the whole surface, BPSG layer 73B is flattened by annealing. BPSG layer 73B remains in hollows of polysilicon layer 72A only and, except for the hollows, polysilicon layer 72A is exposed by etching the surface of the BPSG layer. Aluminum layer 74B is formed on the whole surface. A bit line is formed by the patterning of polysilicon layer 72A, BPSG layer 73B, and aluminum layer 74B.

According to the method of manufacturing a semiconductor device as described above, since BPSG layer 73B remains in the hollows in addition to the contact hole, overall flatness of the surface situated below aluminum layer 74B is improved. As a result, it is possible to prevent aluminum 74B from opening.

Moreover, since the bit line consists essentially of polysilicon layer 72A and aluminum layer 74B, even if either polysilicon layer 72A or aluminum layer 74B is opened, the bit line is not opened electrically. It is thus possible to improve reliability of a semiconductor device according to the present invention.

Figure 8A:
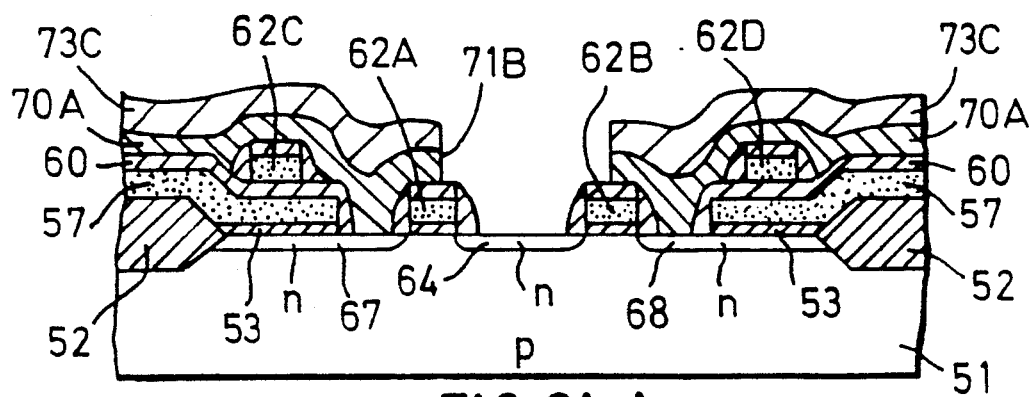
FIGS. 8(a) and (b) are sectional views showing steps of a method of manufacturing a semiconductor device according to a fourth embodiment of the present invention.
Figure 8B:
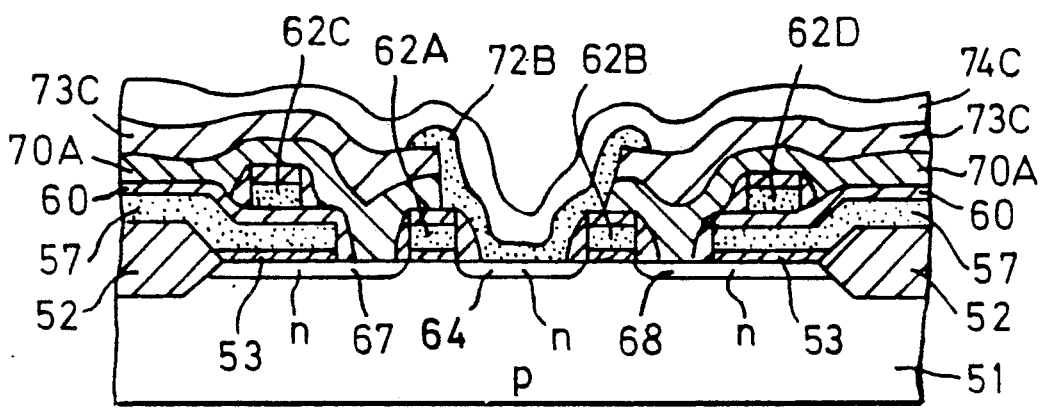

A fourth embodiment of the present invention will be described with reference to FIGS. 8(a) and (b).

The steps of the method of this embodiment are the same steps as shown in FIGS. 5(a) to (e). A silicon dioxide layer is formed on the whole surface by the CVD method, a BPSG layer is formed, and contact hole 71B is formed in the BPSG layer and in the silicon dioxide layer. Later, polysilicon layer 72B is formed, and BPSG layer 73C is flattened by thermal annealing. Bit line 74C is then formed.

According to the method of manufacturing a semiconductor device as described above, after the BPSG layer is flattened by thermal annealing, the surface of the semiconductor substrate in contact hole 71B is covered with polysilicon layer 72B. Therefore, it is possible to prevent boron or phosphorus produced from the BPSG layer from diffusing into semiconductor substrate 51.

Figure 9A:
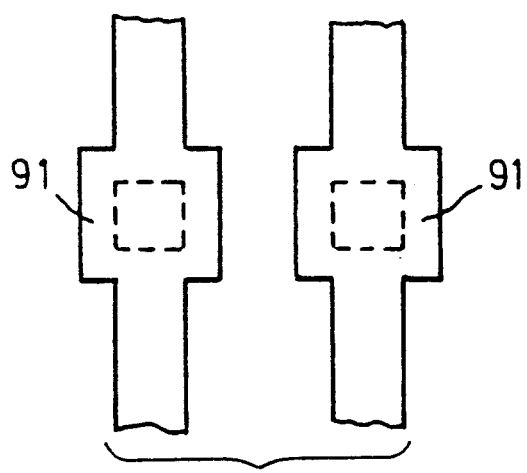
FIGS. 9(a) and (b) are schematic top views of wiring of a semiconductor device of the present invention according, respectively, to a conventional method and to the method of the present invention.
Figure 9B:
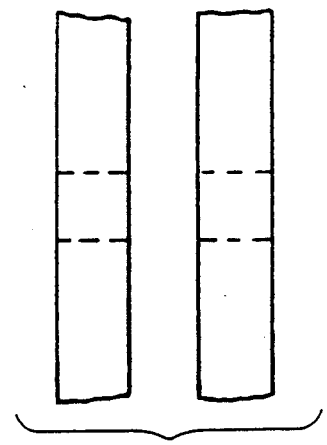

FIG. 9(a) shows a pattern of wiring on a contact hole having a wiring fringe according to prior art. FIG. 9(b) shows a pattern of wiring on a contact hole not having a wiring fringe according to the present invention.

Pattern gaps sometimes occur in the mask used to form the wiring layer of a semiconductor device. This can result in an increase in resistance of the wiring layer. To avoid such a resistance increase, semiconductor devices formed according to methods of the prior art often include a writing fringe 91, as shown in FIG. 9(a). However, this limits the degree of microminiaturization which can be achieved. In semiconductor devices manufactured according to the present invention, the surface of the layer below the bit line on the contact hole is flattened. Thus, even if a pattern gap of the wiring layer mask is present, an increase of wiring layer resistance will not occur. Therefore, as shown in FIG. 9(b), the wiring pattern can be made straight without a wiring fringe, thus improving the microminiaturization of the wiring pattern.

The present invention is not limited to the embodiment as described above, but rather modifications can be made without departing from the spirit or scope of the invention.

For example, the material of the first conductive layer may be of the silicon material group (for example, crystal silicon, amorphous silicon) instead of polysilicon.

Moreover, the material of the flattening layer may be PSG (Phosphorus Silicate Glass) or BSG (Boron Silicate Glass) instead of BPSG. Moreover, the material of the flattening layer may be SOG (Spin On Glass) which is liquid from the beginning of the process, instead of BPSG. In the present method when using SOG, liquid SOG is coated on a semiconductor substrate by spinning, and the SOG is hardened by evaporating the solvent portion of the SOG at a temperature of 100°-500° C. As a result, the contact hole or differences in level of surfaces are covered by the SOG layer.

Moreover, the material of the first conductive layer may be aluminum instead of polysilicon. However, in the present method when using aluminum as a material of the first conductive layer, SOG (Spin On Glass) must be used as the material of the flattening layer instead of BPSG, since it is impossible to flatten the layer by annealing.

Moreover, it is possible to reduce the value of the resistance of the word line by performing ion implantation on the polysilicon layer.

Moreover, the material of bit line may be a refractory metal silicide (for example, $MoSi_2$, $TiSi_2$, WSi) or a refractory metal (for example, Mo, Ti, W) or a polycide, instead of silicide.

According to the methods and apparatus of the invention as described above, reliability of a semiconductor device can be improved, and a highly integrated semiconductor device can be realized.

What is claimed is:

1. A method of manufacturing a semiconductor memory device which includes a conductive member, comprising the steps of:
   forming an insulating layer over the conductive member;
   forming a contact hole through the insulating layer by etching a predetermined part of the insulating layer;
   forming a first conductive layer on the insulating layer and in the contact hole, said first conductive layer being formed with hollows therein;
   forming a flattening layer on the first conductive layer;
   reducing the surface level variation of the flattening layer by annealing the flattening layer to permit the flattening layer to remain only in the hollows of the first conductive layer;
   exposing a part of the first conductive layer by etching the flattening layer; and
   forming a second conductive layer on the flattening layer and the exposed part of the first conductive layer.

* * * * *